United States Patent [19]

Crosby

[11] Patent Number: 5,157,290

[45] Date of Patent: Oct. 20, 1992

[54] PHASE DETECTOR

[75] Inventor: Philip S. Crosby, Portland, Oreg.

[73] Assignee: Tektronix, Inc., Wilsonville, Oreg.

[21] Appl. No.: 664,907

[22] Filed: Mar. 5, 1991

[51] Int. Cl.[5] .............................................. H03K 5/00
[52] U.S. Cl. .................................. 307/511; 328/133; 331/25
[58] Field of Search ................ 307/510, 511; 328/133, 328/134, 155; 331/25

[56] References Cited

U.S. PATENT DOCUMENTS

| | | | |
|---|---|---|---|
| 3,860,954 | 1/1975 | Tsuchiya | 307/511 X |
| 3,939,434 | 2/1976 | Crosby . | |
| 4,160,217 | 7/1979 | Ohsawa | 307/511 X |
| 4,316,150 | 2/1982 | Crosby . | |
| 4,959,618 | 9/1990 | Shier | 331/25 |

FOREIGN PATENT DOCUMENTS 0034453  3/1978  Japan ................................. 307/511

*Primary Examiner*—Robert J. Pascal
*Attorney, Agent, or Firm*—Francis I. Gray

[57] ABSTRACT

A sampling phase detector for a phase locked loop system receives a gate signal derived from the output of a voltage controlled oscillator to enable the phase detector. A reference signal is applied to the phase detector to charge one of two capacitors during the gate period, the capacitor being charged being determined by the state of the reference signal. At the end of the gate period the difference in charge between the two capacitors is transferred to the output of the phase detector as a control voltage signal to correct the output of the voltage controlled oscillator to be in phase wiht the reference signal.

6 Claims, 1 Drawing Sheet

PHASE DETECTOR

BACKGROUND OF THE INVENTION

The present invention relates to phase locked loop systems, and more particularly to a sampling phase detector for a divide-by-n phase locked loop system that substantially reduces phase noise and spurious phase modulation components at harmonics of a sampling frequency.

There is a continual need for circuit arrangements that provide a second signal in accurately timed relationship with a first signal. Phase locked loops are commonly used to accomplish this end. In a phase locked loop the two signals are applied to a phase detector, the output of which is a function of the phase difference between the two signals. An error voltage is developed that is applied to the control input of a voltage controlled oscillator after lowpass filtering in a loop filter to make the oscillator signal phase follow a reference signal phase. Although in most second order phase locked loops an error amplifier is inserted between the phase detector and the voltage controlled oscillator, as shown in U.S. Pat. No. 4,316,150 issued Feb. 16, 1982 to Philip S. Crosby entitled "Phase Locked Loop Including Phase Detector System Controlled by Enable Pulses", the error amplifier may be omitted, reducing one source of phase and frequency noise fluctuations.

However in the prior Crosby phase locked circuit an undesired signal component at the repetition frequency of the enable pulses, and harmonics thereof, is produced. The amplitude of this undesired signal component is proportional to the square of the width of the enable pulse and contributes an undesired fluctuation in the frequency of the voltage controlled oscillator if the phase locked loop bandwidth is sufficiently large and/or the enable pulse is sufficiently wide. Furthermore the transistors that provide the output signal to the loop filter must have an area commensurate with the current being switched as well as an operating speed commensurate with the width of the enable pulse. These requirements may not be compatible with other desired device parameters, namely, minimal leakage currents and levels of shot noise.

What is desired is a sampling phase detector that has reduced levels of undesired signal components to permit increased loop bandwidth and capture range, that has reduced output device area to permit lower levels of leakage current, thereby reducing static offsets, and that has reduced operating speed of the output devices to permit the use of devices having a reduced noise level.

SUMMARY OF THE INVENTION

Accordingly the present invention provides a sampling phase detector that receives a gate signal derived from a voltage controlled oscillator output signal and a strobe signal from a reference signal source. During the gate period a first capacitor is charged from an initial level until the strobe signal occurs, at which time a second capacitor is charged until the end of the gate period. At the end of the gate period the difference in charge between the two capacitors is transferred to the output of the phase detector as a control voltage signal that is then applied to the control input of the voltage controlled oscillator to regulate the frequency and phase.

The objects, advantages and novel features of the present invention are apparent from the following detailed description when read in conjunction with the appended claims and attached drawing.

DESCRIPTION OF THE PREFERRED EMBODIMENT

Figure 1:
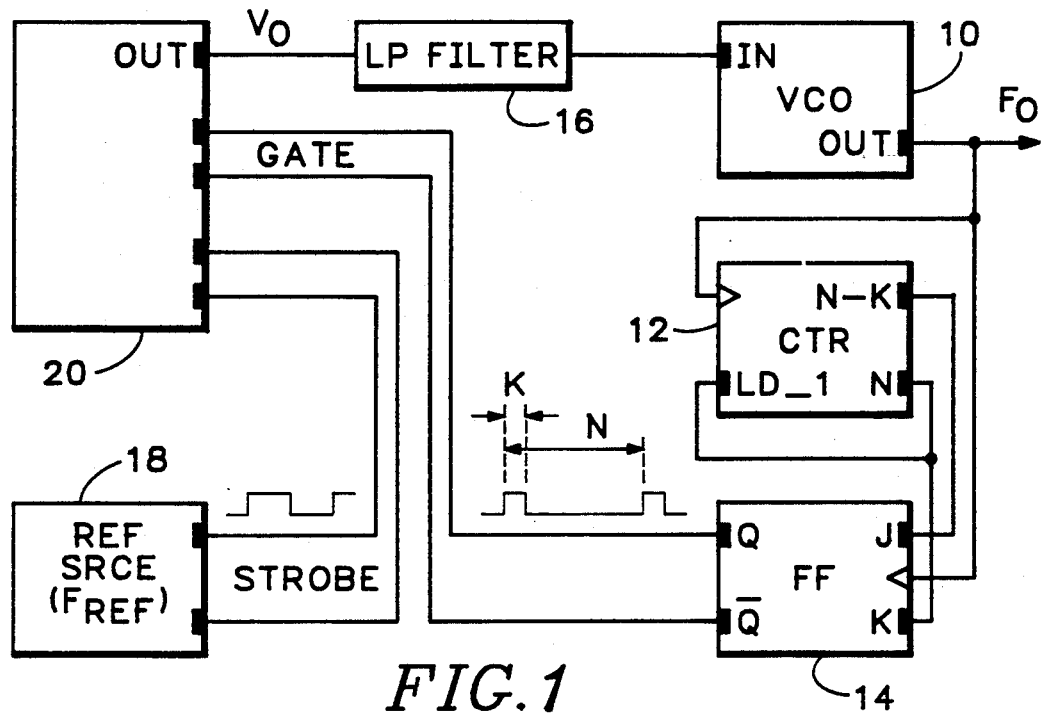
FIG. 1 is a block diagram of a phase locked loop using a sampling phase detector according to the present invention.

Referring now to FIG. 1 a voltage controlled oscillator 10 has a control input and provides an output that has a fundamental frequency, Fo. Fo is variable according to the voltage level of a control signal, Vo, applied to the control input. Fo is coupled to clock inputs of an up counter 12 and a J-K flip-flop 14. The up counter 12 functions as a divide by N counter, and the J-K flip-flop in conjunction with the counter serves as a pulse width circuit. The N-K output of the counter 12 is coupled to the J-input of the flip-flop 14, while the N output of the counter is coupled to the K-input of the flip-flop. The N output of the counter 12 is also coupled back to a load terminal to reset the counter to one on the next clock pulse of Fo after N. At time N-K clock pulses of Fo, the gate signal, GATE, output from the flip-flop 14 is activated to be high at the Q output and low at the Q output to provide a differential gate signal. At time N the gate signal is inactivated, resulting in a gate pulse width of K clock cycles of Fo. The differential GATE signal and a differential STROBE signal from a reference source 18 at frequency Fref are input to a phase detector 20. The output of the phase detector 20 is the control voltage signal, Vo, that is coupled to the control input of the voltage controlled oscillator 10 via a lowpass filter 16.

Figure 2:
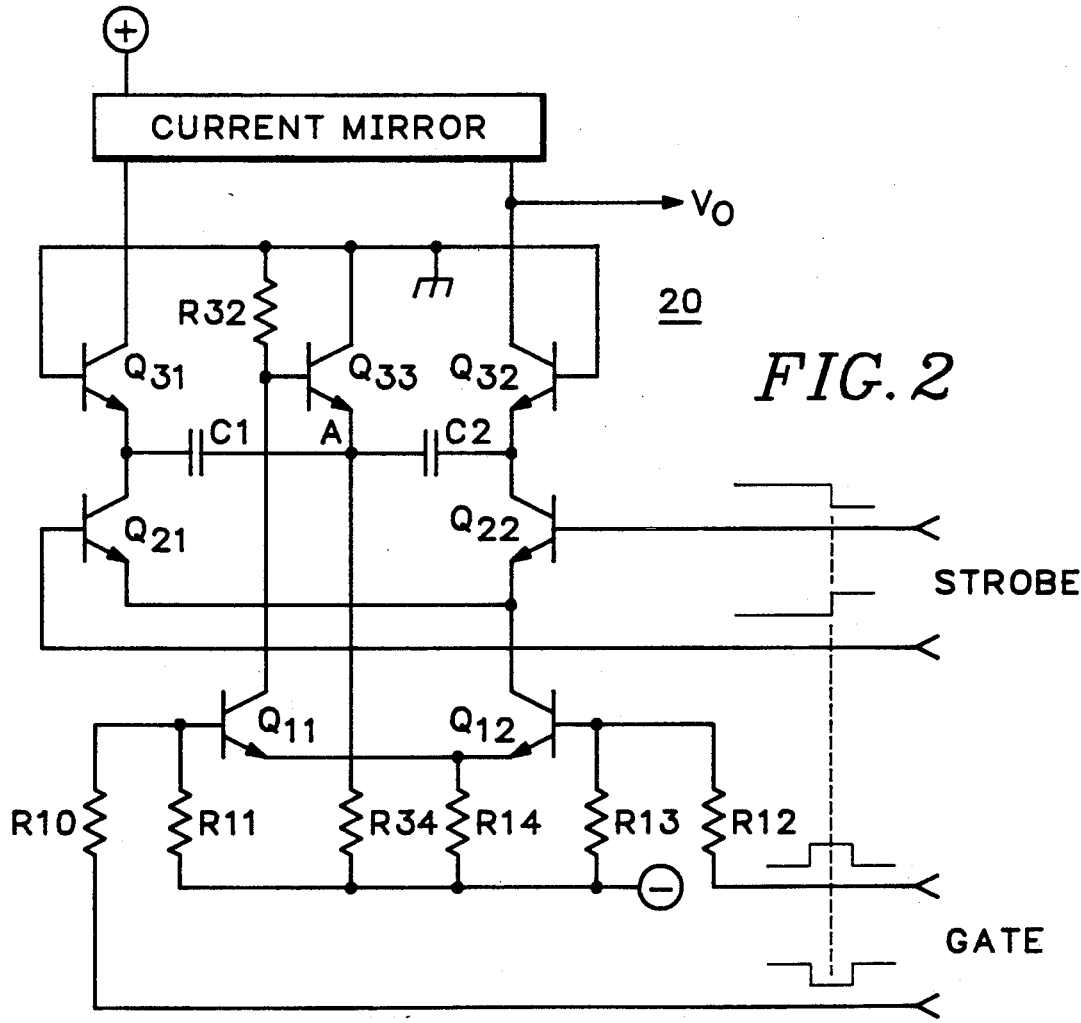
FIG. 2 is a schematic diagram of the sampling phase detector according to the present invention.

As shown in FIG. 2 the differential GATE signal is applied via resistors R10, R12 to the bases of transistors Q11, Q12. The bases of Q11, Q12 are biased by resistors R11, R13 returned to a first voltage rail, Vee. A current source of resistor R14 is coupled between the common emitters of Q11, Q12 and the first voltage rail. The differential GATE signal steers the current through resistor R14 between either transistor Q11 or transistor Q12. The differential STROBE signal is applied to the bases of transistors Q21, Q22, and the emitters are coupled to the collector of transistor Q12. The collectors of Q21, Q22 are coupled to the respective emitters of transistors Q31, Q32. Coupled between the collectors of Q21, Q22 are a pair of capacitors C1, C2 in series. The collectors of Q31, Q32 are coupled to a current mirror 18, such as the one disclosed in U.S. Pat. No. 3,939,434 issued Feb. 17, 1976 to Philip Stephen Crosby entitled "Wideband DC Current Amplifier", with the control voltage signal, Vo, being taken from the collector of Q32. The bases of Q31, Q32 are returned to a second voltage rail, such as ground.

A charge transistor Q33 has a collector coupled to the second voltage rail and an emitter coupled to a junction A between the two capacitors Cl, C2. The base of Q33 is biased by resistor R32 coupled to the second voltage rail, and also is coupled to the collector of transistor Q11. The junction A between the capacitors C1, C2 is returned to the first voltage rail via resistor R34.

In operation the differential GATE signal is derived from the voltage controlled oscillator 10 and occurs at a frequency Fo/N where N is the desired division ratio. The width of the GATE pulse is chosen to accommodate the expected phase fluctuations between the voltage controlled oscillator output, Fo, and the reference input, Fref. For example in one application Fo is approximately 75 MHz, N is 2200 and the GATE pulse is eight cycles of Fo wide, approximately 100 nsec. C1 and C2 are substantially equal, and C1 and R32 are chosen so that they form a time constant that exceeds the width of the GATE pulse by a reasonable margin. The ratio of the current in R34 compared to the current in R32 is greater than the duty factor of the GATE signal.

When the GATE signal is inactive, emitter current through R14 is steered through Q11 and flows through R32. If the GATE signal has been inactive for a sufficient interval, the emitter of Q33 clamps the junction between C1, C2 at a potential that is one base-emitter drop below the negative end of R32. Only Q11 and Q33 conduct at this time.

When the GATE signal goes active, the emitter of Q33 rises, enabling the phase detector 20, and the current through R14 is now steered through Q12 and Q22 to charge capacitor C2. C2 accumulates charge equal to the collector current through Q22 multiplied by the time from the beginning of the GATE pulse to the rise of STROBE. At the rise of STROBE current through Q12 is steered from Q22 to Q21 to charge capacitor C1. C1 likewise accumulates charge equal to the collector current through Q21 multiplied by the time from the beginning of STROBE until the end of GATE. Neither Q31 nor Q32 conduct an appreciable current while GATE is active.

When the GATE signal goes inactive again, Q33 becomes nonconductive and the charge collected on C1, C2 flows through Q31, Q32 at a rate that is determined by R34. Thus the net charge delivered to the output as Vo is nearly equal to the difference between the charges collected on the capacitors C1, C2 when GATE was active. The charge collected by C1, C2 is not transferred to the output until after GATE goes inactive. Thus if the STROBE signal bisects the GATE signal, then there is essentially no frequency component at the repetition frequency of the GATE signal appearing at the output, Vo. It should be noted that the sources of the GATE and STROBE signals may be interchanged, i.e., a suitable STROBE signal may be generated from the voltage controlled oscillator output by making K nearly equal to N/2 and by causing the Fref signal to produce a GATE waveform of the desired width.

Thus the present invention provides a sampling phase detector for a phase locked loop system that is free from phase and frequency noise fluctuations by charging alternately two capacitors during a gate period, the capacitor being charged being determined by where a reference frequency signal transitions within the gate period, and then transferring the difference in charge between the two capacitors to the output as a control voltage signal after the gate period.

What is claimed is:

1. A phase detector of the type having as inputs a reference signal and an enable pulse to produce a control voltage signal comprising:
   means for enabling the phase detector in response to the enable pulse;
   means for steering charge from the enabling means to one of two capacitors as a function of the reference signal during the enable pulse; and
   means coupled to the enabling and steering means for transferring the difference in charge between the two capacitors to an output as the control voltage signal.

2. A phase detector as recited in claim 1 wherein the enabling means comprises a differential pair of transistors having emitters coupled to a current source and bases coupled to receive the enable pulse as a differential input, and having the collector of one of the differential pair of transistors coupled to the steering means, and the collector of the other of the differential pair of transistors coupled to the transferring means.

3. A phase detector as recited in claim 1 wherein the steering means comprises a differential pair of transistors having emitters coupled together and to the enabling means, bases coupled to receive the reference signal as a differential input, and collectors coupled to the transferring means and to opposite ends of the two capacitors, which capacitors are connected in series, the reference signal serving to steer current from the enabling means to one or the other of the differential pair of transistors to charge one or the other of the capacitors as a function of the reference signal.

4. A phase detector as recited in claim 1 wherein the transferring means comprises:
   a differential pair of transistors having emitters coupled to the opposite ends of the two capacitors and to the steering means, which capacitors are connected in series, and bases coupled to a potential source, the collector of one of the differential pair of transistors being the output; and
   a transistor having a base coupled to the enabling means, an emitter coupled to a junction between the two capacitors, and a collector coupled to the potential source.

5. A phase detector as recited in claim 4 wherein the transferring means further comprises a current mirror coupled to the collectors of the differential pair of transistors.

6. A phase detector comprising:
   an enabling differential pair of transistors to which a gate signal is applied as a differential input, the emitters being coupled to a common current source;
   a steering differential pair of transistors to which a reference signal is applied as a differential input, the emitters being coupled together to one of the collectors of the enabling differential pair of transistors;
   a transferring differential pair of transistors having the bases coupled to a potential source and the emitters coupled to the respective collectors of the steering differential pair of transistors;
   a current mirror coupled to the collectors of the transferring differential pair of transistors, one of the collectors of which provides a control voltage signal as an output of the phase detector;
   a pair of capacitors coupled in series between the collectors of the controlling differential pair of transistors; and
   a charging transistor having the base coupled to the other collector of the enabling differential pair of transistors and to the potential source through a resistor, the emitter coupled to a junction node between the pair of capacitors and to a second current source, and the collector coupled to the potential source.

* * * * *